United States Patent [19]
Fujiwara

[11] Patent Number: 5,661,057
[45] Date of Patent: Aug. 26, 1997

[54] METHOD OF MAKING FLASH MEMORY

[75] Inventor: Masakazu Fujiwara, Kawasaki, Japan

[73] Assignee: Fujitsu Limited, Kawasaki, Japan

[21] Appl. No.: 688,243

[22] Filed: Jul. 29, 1996

Related U.S. Application Data

[62] Division of Ser. No. 423,817, Apr. 18, 1995, Pat. No. 5,568,422, which is a continuation of Ser. No. 32,247, Mar. 17, 1993, abandoned.

[30] Foreign Application Priority Data

Mar. 18, 1992 [JP] Japan ................. 4-061791

[51] Int. Cl.$^6$ ............... H01L 21/265; H01L 21/8247
[52] U.S. Cl. ............... 438/257; 438/261; 438/264
[58] Field of Search ................... 437/43, 48, 52

[56] References Cited

U.S. PATENT DOCUMENTS

| | | | |
|---|---|---|---|
| 5,208,175 | 5/1993 | Choi et al. | 437/43 |
| 5,372,963 | 12/1994 | Mori | 437/48 |
| 5,534,455 | 7/1996 | Liu | 437/43 |
| 5,547,884 | 8/1996 | Yamaguchi et al. | 437/43 |
| 5,589,412 | 12/1996 | Iranmanesh et al. | 437/43 |

*Primary Examiner*—John Niebling
*Assistant Examiner*—Richard A. Booth
*Attorney, Agent, or Firm*—Armstrong, Westerman, Hattori, McLeland & Naughton

[57] ABSTRACT

Flash memories are produced by a novel production method according to the invention, the method comprising removing field insulation films by an etching process using side walls provided adjacent to gate portions consisting essentially of a floating gate electrode, a control gate electrode, and an inter-gate insulation film, as part of a mask for the etching. The inventive method allows the production of higher integrated flash memories without causing damage, particularly degradation of dielectric strength, to the portion of a gate insulation film situated between part of the floating gate electrode and an impurity diffused source electrode formed in the substrate.

21 Claims, 7 Drawing Sheets

METHOD OF MAKING FLASH MEMORY

This is a divisional, of application Ser. No. 08/423,817 filed Apr. 18, 1995; now U.S. Pat. No. 5,568,422 which is a continuation of application Ser. No. 08/032,247 filed Mar. 17, 1993, now abandoned.

BACKGROUND OF THE INVENTION

1. Field of the Invention

The present invention relates to a semiconductor device having an MOS (metal-oxide semiconductor) construction, particularly a device called a flash memory, and a method of the production thereof.

As a non-volatile storage, for example, an EPROM (erasable programmable read only memory) is known in which stored data can be erased by irradiation of ultraviolet rays. Since an EPROM requires a step for the irradiation of ultraviolet rays and costs of the rewriting of data, an EEPROM (electrically erasable programmable read only memory) has recently been employed as a non-volatile storage capable of electrically rewriting data. Among various types of EEPROM, a flash memory capable of collectively erasing data in units of words or chips has particularly been considered as a non-volatile storage substituting for magnetic storage mediums such as floppy disks.

2. Description of the Related Art

Generally speaking, there are two types of flash memory; one is a NAND-type flash memory, and the other a NOR-type flash memory. For the production of flash memories, some methods are known in the art.

In one typical method of producing a NOR-type flash memory, an oxidized film prepared on a silicon wafer surface is patterned to form a given field oxidation film, and at least two gate electrodes provided with floating and control gate electrodes and an impurity diffused region between the gate electrodes for a common source electrode are then formed. In this method, a photolithography process is used for the formation of the field oxidation films, in which a resist pattern is transferred to the underlying oxidized film. A photolithography process is also used for fabricating the gate electrodes. Owing to the difficulty in the precise transfer of a fine resist pattern by photolithography, the pattern transfer is not always fully effected (particularly, the corners of each of the formed field oxidation films are often rounded), and in the case of a deviated mask alignment when making the gate electrodes, the relation between the locations of the gate electrodes and the field oxidation films is deviated from the intended state, and consequently, variability of characteristics of the memory cells can be caused. The higher the integration in a flash memory, the graver these problems.

There is another method of manufacturing a flash memory, in which gate electrodes are formed on a gate oxidation film and field oxidation films, and the gate oxidation film and the field oxidation films are then patterned between the gate electrodes in order to make an impurity diffused region for a common source electrode between the gate electrodes. In the process of the formation of the impurity diffused region, a resist film is patterned so as to cover the gate electrodes and a region not to be etched, and the exposed oxide films are then anisotropically etched by, e.g., reactive ion etching. To fully cover the gate electrodes, a margin for mask alignment is required between each of the gate electrodes and the region to be etched, i.e., the gate electrodes inevitably have a resist material having a certain width in the side toward the region to be etched between the electrodes. The need for the space for the mask alignment margin is disadvantageous for the high integration in a flash memory.

Thus, known methods of making a flash memory use a photolithography process to form an impurity diffused region for a common source electrode. In addition, no method is known in which an impurity diffused region in a flash memory is self-alignedly formed. To provide a method, which allows a highly integrated flash memory to be created in a self-aligned manner, would therefore be beneficial in the art.

In the production of semiconductor devices other than a flash memory, it is known to use a side wall formed immediately adjacent to the side of a gate electrode, as a mask to effect the etching of a substrate and the ion implantation thereinto.

For example, JP 3-46275(A) discloses a method of making a semiconductor device, in which spacers (i.e., side walls) are formed on both sides of a gate electrode, the spacers are then used, as masks, to etch a semiconductor substrate on which the gate electrode and the spacers have been formed, and to then implant an impurity ion into the etched regions of the substrate. The ion-implanted regions are allocated to source and drain regions in a transistor.

JP 2-72671(A) discloses a method of manufacturing a non-volatile memory device such as an EPROM. The method makes it possible to make a non-volatile memory device in which both source and drain regions of transistor of the memory cell thereof are each made up of regions having a high density and a low density of impurity. According to the disclosure of the document, layers of an insulation film, a floating gate electrode, another insulation film, and a control gate electrode are formed in sequence on a semiconductor device; a control gate electrode is then preferentially formed; an impurity ion is implanted into the regions of semiconductor in both sides of the formed control gate electrode using it as a mask; side walls are formed on both sides of the control gate electrode, and then used to pattern the underlying floating gate electrode; and subsequently, the control gate electrode and side walls are used as a mask for a further ion implantation.

To the applicant's knowledge, no methods are known in which the production of a highly integrated flash memory is effected using a side wall immediately adjacent to a side of a gate electrode to self-alignedly form an impurity diffused region to be used as a common source electrode.

SUMMARY OF THE INVENTION

It is an object of the invention to provide a method of producing a flash memory which makes it possible to self-alignedly produce a highly integrated NOR-type flash memory.

The method of the invention thus comprises:

(a) forming gate insulation films and field insulation films on a surface of a semiconductor substrate of one type of conduction, (b) forming at least a pair of gate portions on selected surface regions of the gate insulation films and the field insulation films by patterning, the gate portion consisting essentially of a floating gate electrode, a control gate electrode, and an inter-gate insulation film between the floating and control gate electrodes, (c) introducing an impurity of another type of conduction, which is opposed to the type of conduction of the substrate, into the regions not covered by the gate portions and along the longitudinal direction of the gate portions, (d) forming an insulator film so as to cover the gate portions and the films on the substrate, (e) etching back the insulator film using an etchant gas having a sufficient difference of etching rates for the gate portion and the insulator film so as to expose the gate insulation film and selectively leave side walls adjacent to the sides of the gate portion, thereby covering the portions of the films adjacent to the gate portion, (f) exposing the portion of silicon substrate located between the pair of gate portions and uncovered by the side walls formed in step (e), by selectively etching the field insulation films on the region of the substrate to be exposed, and (g) selectively introducing an impurity of the other type of conduction, which is opposed to the type of conduction of the substrate, into the region of the exposed substrate between the pair of electrode portions, thereby forming an impurity introduced region in the substrate between the pair of gate portions, which extends to a portion of the substrate situated under a part of each of the gate portions.

The invention also provides a flash memory of NOR-type produced according to the above described method. The flash memory of the invention comprises at least a pair of stacked gate portions consisting essentially of a first gate electrode provided over a surface of a semiconductor substrate through a gate insulation film interposed therebetween, an inter-gate insulation film on the first gate electrode, and a second gate electrode on the inter-gate insulation film, and source and drain electrodes used to charge electrons for data storage to the first gate electrode and discharge the same therefrom, wherein a side wall of an insulation material is provided adjacent to the side of the stacked gate portion and on the gate insulation film, and an impurity diffused electrode is formed in the semiconductor substrate between the pair of gate portions, which extends to the portion of the substrate situated under a part of each of the gate portions.

BRIEF DESCRIPTION OF THE DRAWINGS

The above and other objects and advantages of the present invention will be apparent from the following detailed description given with reference to the accompanying drawings, in which.

DESCRIPTION OF THE PREFERRED EMBODIMENTS

In flash memories, it is required to have a common source electrode for allowing the simultaneous erasure of stored data. For the high integration of flash memory, it is advantageous to provide a common source electrode between an adjacent pair of gate electrodes. A NOR-type flash memory of this type can be easily made according to the method of the invention.

Figure 1:
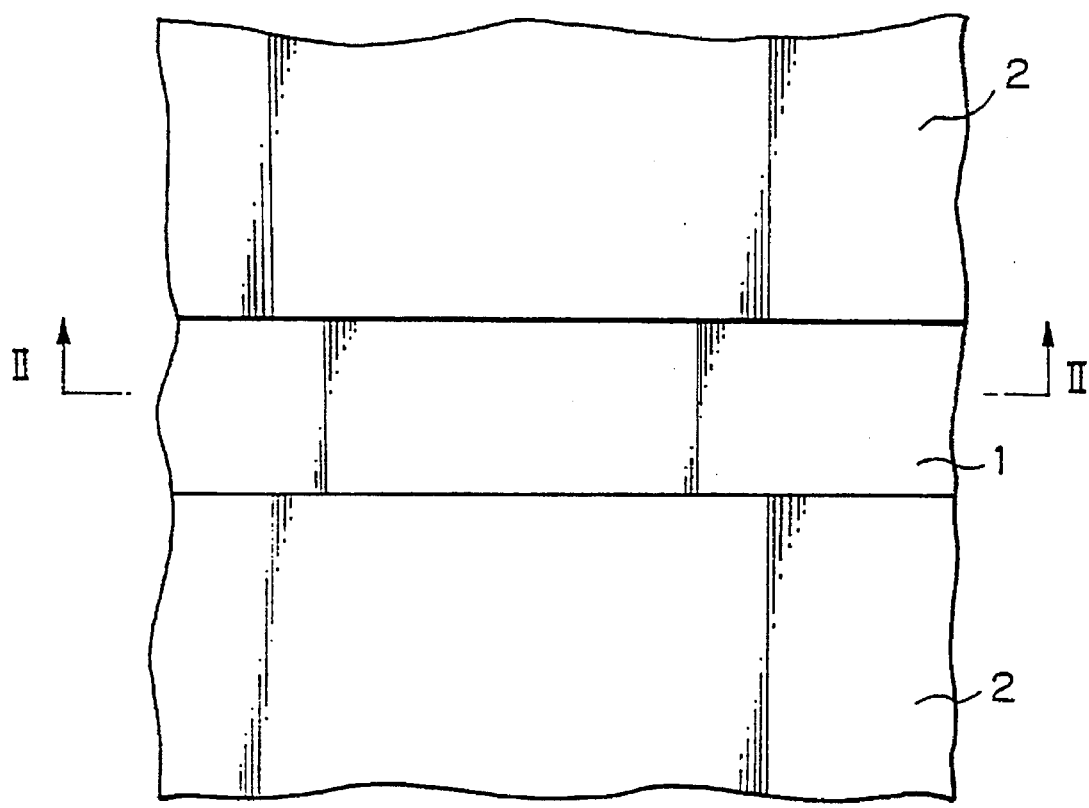
FIG. 1 shows oxidized films formed on a surface of a silicon substrate.

FIG. 1 partly shows oxidized films 1, 2 formed on a surface of a silicon substrate, not shown; the film 1 is a gate insulation film, and the film 2 is a field insulation film of an isolation region. The film 2 is formed by, e.g., a process of local oxidation of silicon (LOCOS process) using a silicon nitride film, not shown, as a mask. After the formation of the field oxidation film 2, the gate insulation film 1 is formed by removing the nitride film, and then thermally oxidizing the exposed surface of the silicon substrate. The gate oxidation film 1 thus formed has a thickness of 120 angstroms, and the field oxidation film 2 has a thickness of 6000 angstroms.

A field insulation film may be formed by any suitable process including a LOCOS process described above and a chemical vapor deposition process. A field insulation film can be an SOG (spin-on-glass) film which is formed by spin coating and firing. In addition to an oxide, the material of insulation films may be selected from other materials such as a nitride.

The following description for the production of a flash memory according to the invention will be made with reference to FIGS. 2A to 2G, which show a sectional view taken along II—II line in FIG. 1.

Figure 2A:
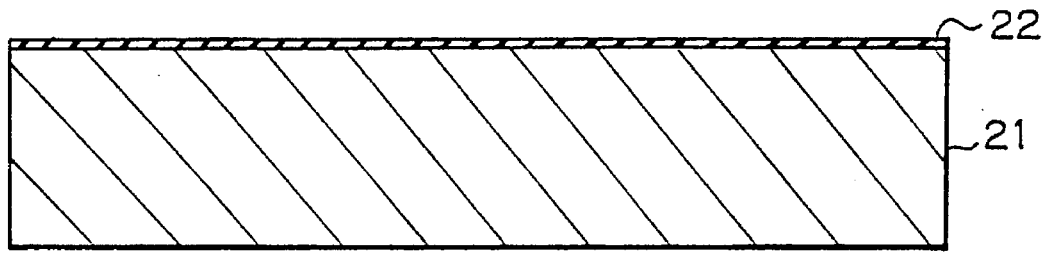
FIGS. 2A to 2G illustrate the production of a flash memory according to the invention.

FIG. 2A shows a p-type silicon substrate 21 and a gate insulation film 22 of $SO_2$ formed on the substrate 21 and having a thickness of 120 angstroms.

Figure 2B:
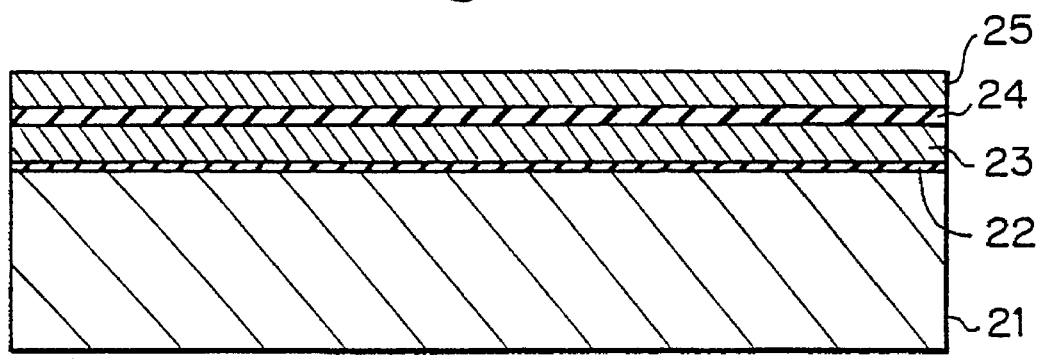

Subsequently, as shown in FIG. 2B, a first polysilicon layer 23 having a thickness of 1000 angstroms is deposited on the gate oxidation film 21 by a CVD (chemical vapor deposition) process, which is doped with phosphorus as impurity to thereby be provided with conductivity, and later forms a floating gate electrode. On this polysilicon layer 23, an $SiO_2$ layer 24 having a thickness of 300 angstroms is formed by thermal oxidation of the layer 23, which forms an inter-gate insulation film later. It is more advantageous for the layer 24 to be made up of an ONO film of three-layer construction, i.e., a film consisting of a first layer of silicon oxide, a second layer of silicon nitride, and a third layer of silicon oxide. An ONO film may be formed by thermally oxidizing the top portion of a silicon film for a floating gate electrode, subsequently depositing silicon nitride on the thermally oxidized silicon by CVD, and then thermally oxidizing the top portion of the deposited silicon nitride. Use of such an ONO film for an inter-gate insulation film allows an improvement in reliability of the insulation film. On the layer 24, a second polysilicon layer 25 having a thickness of 2000 angstroms is further deposited by a CVD process, which is also doped with phosphorus, and forms a control gate electrode later. The laminate consisting of these three layers 23, 24, and 25 eventually has a total thickness of about 3000 angstroms. Alternatively, the first polysilicon layer 23 may be patterned to make a floating gate electrode prior to the formation of the layers 24 and 25. Furthermore, a material other than polysilicon can be used for the gate electrodes. For example, one of the floating and control gate electrodes may be formed of a laminate consisting of a layer of polysilicon and a layer of silicide of a metal having a high melting point.

Figure 2C:
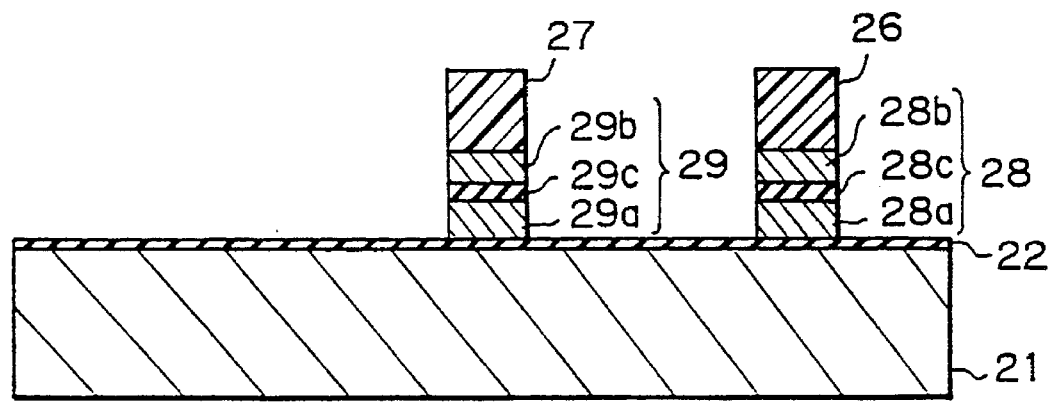

A photoresist is then coated on the second polysilicon layer 25, and patterned by a photolithography technique to thereby form resist masks 26 and 27 (FIG. 2C). Using the resist masks 26 and 27 as etching masks, the second polysilicon layer 25, the $SiO_2$ layer 24, and the first polysilicon layer 23 are etched in sequence by a reactive ion etching, thereby forming gate portions 28 and 29 consisting of floating gate electrodes 28a and 29a, control gate electrodes 28b and 29b, and inter-gate insulation films 28c and 29c, respectively, as shown in FIG. 2C.

The etching conditions used for the etching of polysilicon are as follows:
etchant: HBr
gas pressure: 0.2 Torr
RF frequency: 13.56 MHz
RF powder: 350 W
etching rate: 3000 ang./min.
etching rate ratio of poly-Si to $SiO_2$: 15:1

The etching conditions for silicon nitride are as follows:
etchant: $CF_4+O_2$
gas pressure: 0.4 Torr
RF frequency: 13.56 MHz
RF powder: 350 W
etching rate: 3200 ang./min.
etching rate ratio
of $Si_3N_4$ to $SiO_2$: 9:5

The etching conditions for silicon dioxide are as follows:
etchant: $CF_4+CHF_3$
gas pressure: 0.3 Torr
RF frequency: 13.56 MHz
RF powder: 350 W
etching rate: 2700 ang./min.
etching rate ratio
of $SiO_2$ to $Si_3N_4$: 2:1
etching rate ratio
of $SiO_2$ to poly-Si: 9:1

After the completion of etching, resist masks 26 and 27 are removed by ashing. The pair of gate portions 28 and 29 thus formed has a space therebetween of 1.0 microns.

$As^+$ ions as impurity are then introduced into the silicon substrate 21 through the exposed gate insulation film 22 by an ion implantation process, using the formed gate portions 28 and 29 as masks. The impurity ions are implanted at a dose of $5\times10^{15}/cm^2$ and energy of 70 keV. By the subsequent annealing process, impurity diffused regions 30 (FIG. 2D) are formed.

Subsequently, to form an impurity diffused region for a common source electrode between the pair of gate portions, the field oxidation films 2 (FIG. 1) are removed. The removal of field oxide film can easily be achieved by anisotropically etching (e.g., reactive ion etching) the field oxide film until the surface of the underlying silicon substrate is exposed. The gate oxidation film 22 is also etched during the etching of the field oxidation film. Since the gate oxidation film 22 has a smaller thickness than that of the field oxidation film, the surface of the silicon substrate 21 under the gate oxidation film 22 is exposed in the course of the etching process, and the exposed portion of the silicon substrate is etched in turn.

Thus, the etched side surface of the gate oxidation film 22 is exposed to an etchant and a plasma condition for etching during the etching of the field oxidation film. The etchant ions penetrate the gate oxidation film 22, and cause an imperfect region to be formed in the film 22 near the exposed side surface thereof by the formation of defect and the inclusion of contaminants. The imperfect region thus formed, which can be partly situated under the floating gate 28a, 29a, causes particularly significant problems in a flash memory, because such an imperfect region results in damage to the gate insulation film, particularly the degradation of dielectric strength of the gate oxidation film, which is fatal to the flash memory in which for erasing stored data, electrons having been charged in a floating gate are withdrawn from the floating gate to a common source electrode through the "thin" gate oxidation film as a tunnel oxidation film by using a Fowler-Nordheim tunnel current resulted from the application of "high potential difference" between a control gate electrode and the source electrode.

A similar problem occurs in a type of flash memory in which electrons having been charged in a floating gate are withdrawn therefrom to a channel. In this case, a high electric field may be generated only in a limited small area during the erasure of stored data. If a gate oxidation film has a defect, electrons tend to be withdrawn through the defective portion of the gate oxidation film. After repeating the erasure, the electric field is eventually concentrated at the defective portion, and the defect is enlarged, resulting in unusable memory. Thus, the above problem occurs not only in a type of flash memory in which electrons are withdrawn to a source electrode, but also in a type of flash memory in which electrons are withdrawn to a channel. In general, this problem can commonly occur in all flash memories in which electrons having been charged in a floating gate electrode are withdrawn through a thin gate insulation film by Fowler-Nordheim tunneling.

The above mentioned degradation of dielectric strength of the gate oxidation film owing to the etching process for the removal of field oxidation films is advantageously avoided according to the method of the invention. For the sake of this, the inventive method uses a side wall formed adjacent to the side of the gate portion 28, 29.

Figure 2D:
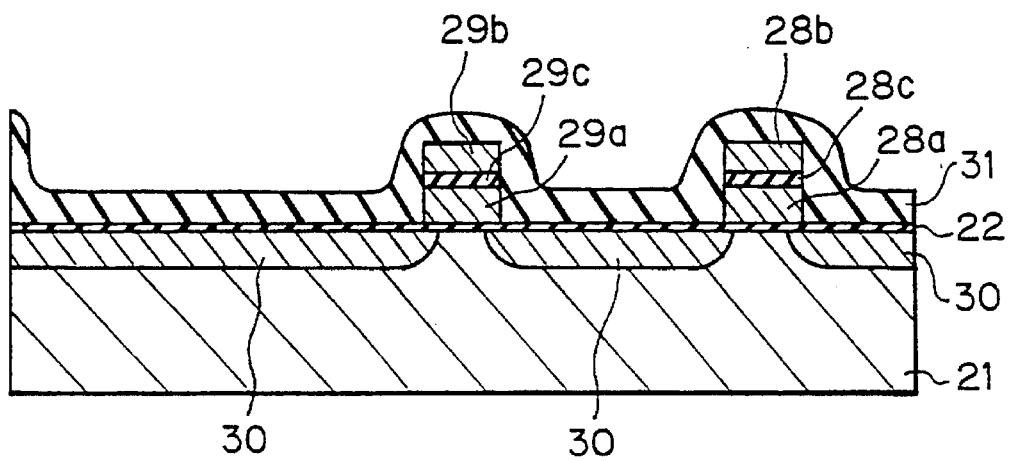

Referring to FIG. 2D, an insulator film 31 of $Si_3N_4$ having a thickness of 3000 angstroms is deposited over the gate portions and oxidation films by a CVD process. The insulator film 31 is used to make side walls adjacent to the side of the gate portion 28, 29, and the insulator is selected from among materials, such as $Si_3N_4$, showing a smaller etching rate for an etchant used than $SiO_2$ of the field oxidation film. The formed insulator film 31 of $Si_3N_4$ is then anisotropically etched by reactive ion etching to create side walls 32, 33 (FIG. 2E) having a width (which will be described below) of 3000 angstroms, using the etching conditions listed above.

A side wall for gate portion is not always made up of a nitride such as $S_3N_4$. Other insulators may be used for the side wall, with the proviso that the following conditions are satisfied.

This insulator side wall functions as a mask during the patterning of an opening in the underlying field insulation film. The insulator side wall must cover at least the side of a floating gate electrode after the completion of the formation of opening by anisotropically etching. For this reason, it would be necessary for the side wall to be made of a material having a sufficiently high etching selectivity for the field insulation film to be etched (the material of the field insulation film is not limited to silicon oxide), or a gate portion having a sufficiently larger height than the thickness of the field insulation film to be etched is formed to provide a side wall having sufficient height compared with the thickness of the field insulation film.

The side wall should have a sufficient width W at the bottom portion thereof (FIG. 2E), i.e., the portion being in contact with the top surface of the gate oxidation film 22 to cover the same, for preventing an imperfect region due to the reactive ion etching from extending to the portion situated under the floating gate electrode 28a, 29a. The necessary width W is estimated to be at least about 300 angstroms in the light of experimental data. In practice, the side wall would have a minimum width of about 1000 angstroms to ensure the effect thereof. The side wall width can readily be adjusted by varying the thickness of the deposited insulator film 31.

Figure 2E:
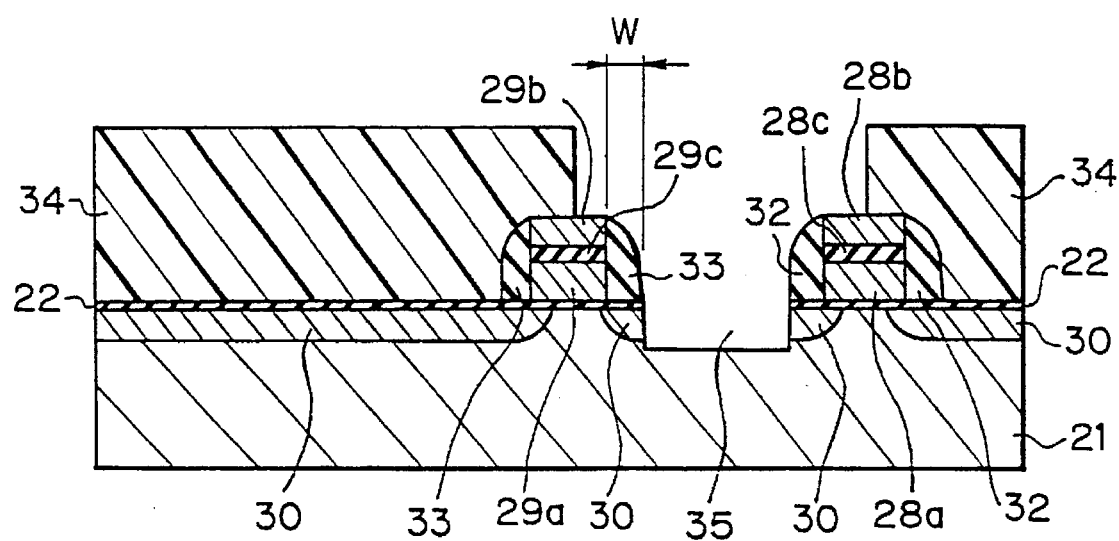
Figure 2F:
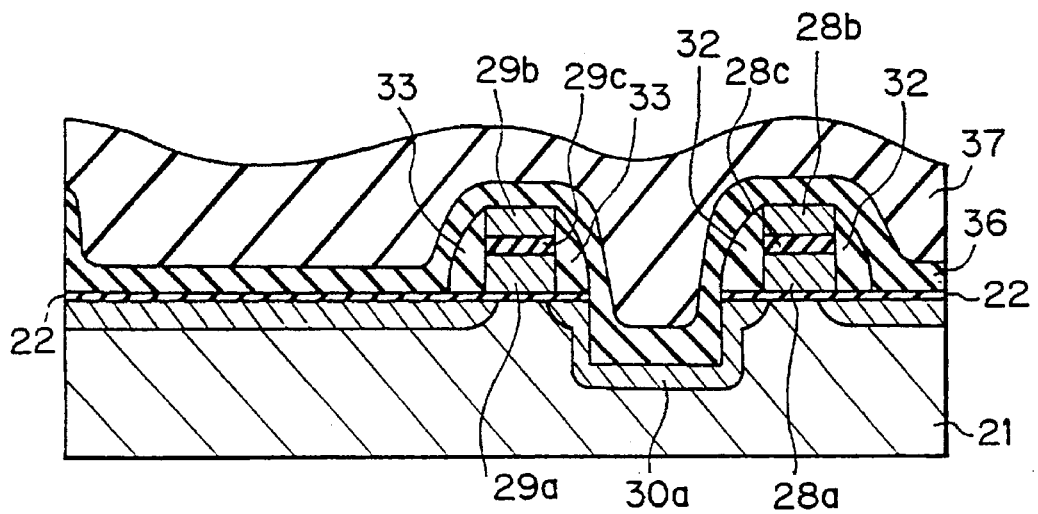

Subsequent to the formation of side walls 32, 33, a photoresist mask 34 is formed by a photolithography technique so as to cover the portions other than the portion to be etched for the exposure of the silicon substrate, as shown in FIG. 2E. Both field oxidation films 2 and gate oxidation films 1 (FIG. 1) of $SiO_2$ are then concurrently removed by etching using the conditions listed above. In this case, the resist mask 34 may leave a part of the control gate electrode 28c, 29c uncovered, as illustrated in FIG. 2E. During the removal of oxidation film by etching, the side walls 32, 33 and, in some cases, the gate portions 28, 29 are thus used as a mask together with the resist mask 34. Since the etching is continued until the silicon substrate located beneath the field oxidation film having a larger thickness than the gate oxidation film is exposed, as described hereinbefore, the silicon substrate beneath the gate oxidation film is more or less trenched at the end of the etching. FIG. 2E schematically shows the trench 35 thus formed having a depth of the order of 1000 angstroms.

$As^+$ ions as impurity are then introduced into the exposed portion of the silicon substrate 21 by an ion implantation process at a dose of $5 \times 10^{15}/cm^2$ and energy of 70 keV. By the subsequent annealing, impurity diffused region 30a (FIG. 2F) is formed, and the resist mask 34 is then removed.

Now, an $SiO_2$ film having a thickness of 2000 angstroms is deposited over all of the regions by a CVD process to make a first interlayer insulating film 36, and on which a second interlayer insulating film 37 consisting of BPSG (borophosphosilicate glass) having a thickness of 6000 angstroms is formed, and then heated at 900° C. for 10 minutes and reflowed to thereby obtain a planarized surface of the second interlayer insulating film 37. BPSG may be replaced with PSG (phosphosilicate glass).

Figure 2G:
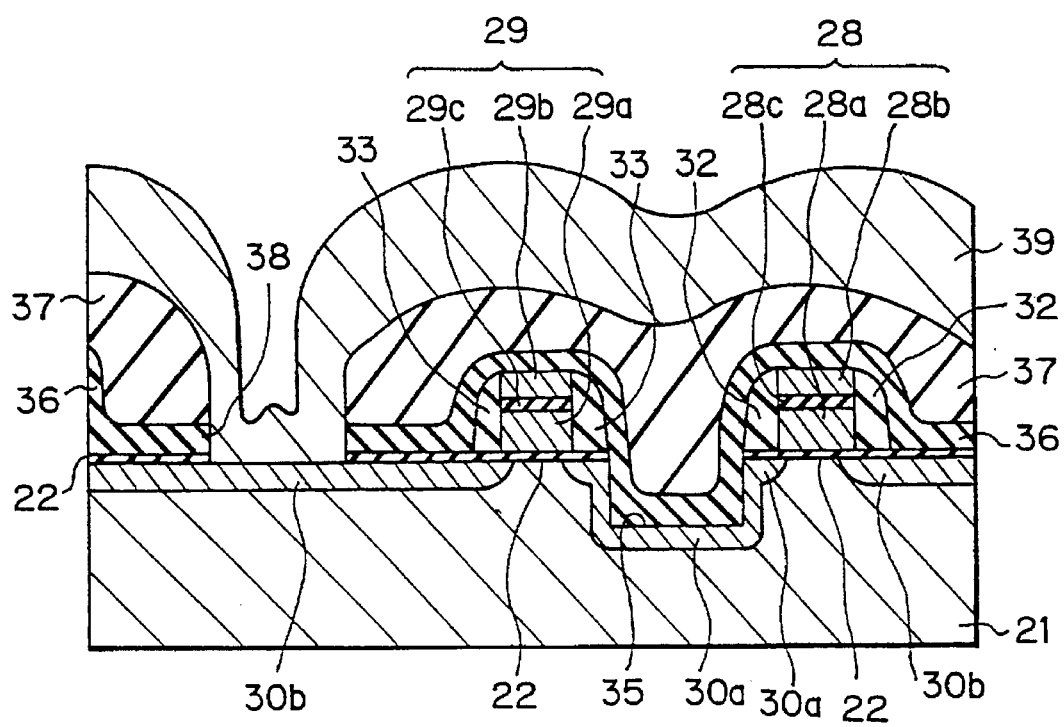

Afterward, a resist mask is formed on the second interlayer insulating film 37, which has a pattern for opening a contact hole, and using the resist mask, the second interlayer insulating film 37, the first interlayer insulating film 36, and the gate oxidation film 22 are removed in turn by etching, to thereby form a contact hole for a drain region 30b, as shown in FIG. 2G. An aluminum film is then formed by a sputtering process to thereby fill the contact hole 38. The aluminum film is subsequently patterned to thus form an interconnection layer 39. (The layer 39 may be made of a conductive material other than aluminum. For example, a conductive layer can be formed by sputtering an aluminum target containing about 1% of silicon and a small amount of copper.) Prior to the sputtering of aluminum, a film of titanium as a barrier metal and a film of titanium nitride may advantageously be formed in order to prevent a possible phenomenon known as an aluminum spike or aluminum pit at the contact hole and other phenomena such as electromigration and stress-migration.

In the flash memory thus produced according to the invention, if data stored in the floating gate electrodes 28a, 29a are simultaneously erased, a high voltage (e.g., about 12 volts) of reverse bias is applied to the common source electrode 30a, and electrons having been stored in the floating gate electrodes 28a, 29a are withdrawn therefrom by a Fowler-Nordheim tunnel current resulting from the electric field established between the floating gate electrodes 28a, 29a and the source electrode 30a (during this erasing process, the drain regions 30b, are being opened). Thus, in the case of a flash memory, the dielectric strength characteristics of the portion of the gate oxidation film 22 interposed between one end of the floating gate electrode 28a, 29a and the source electrode 30a, through which a significantly high potential difference is applied between both the electrodes during the erasure of data stored in the floating gate electrodes 28a, 29a, are particularly important. According to the invention, since the portion in question is covered by the side wall 32, 33 during the etching of the field oxidation film, the imperfect region of the film 22 caused by the etching will not extend to that portion, and the necessary dielectric strength of the gate oxidation film 22 will therefore be secured in that portion.

As referred to hereinbefore, the problem associated with the withdrawing of electrons from a floating gate electrode through a thin insulation film also occurs in other types of flash memory, such as a flash memory in which electrons are withdrawn to a channel. The present invention is equally effective in all flash memories in which electrons having been charged in a floating gate electrode are withdrawn through a thin gate insulation film situated under the floating gate electrode by Fowler-Nordheim tunnel current.

Furthermore, in the flash memories according to the invention, an impurity diffused region 30a can be self-alignedly formed between the pair of gate portions 28 and 29 by etching the oxidation films therebetween using the gate portions 28 and 29 and the side walls 32 and 33. The flash memories according to the invention may therefore have a fine construction accompanied with enhanced reliability.

Figure 3:
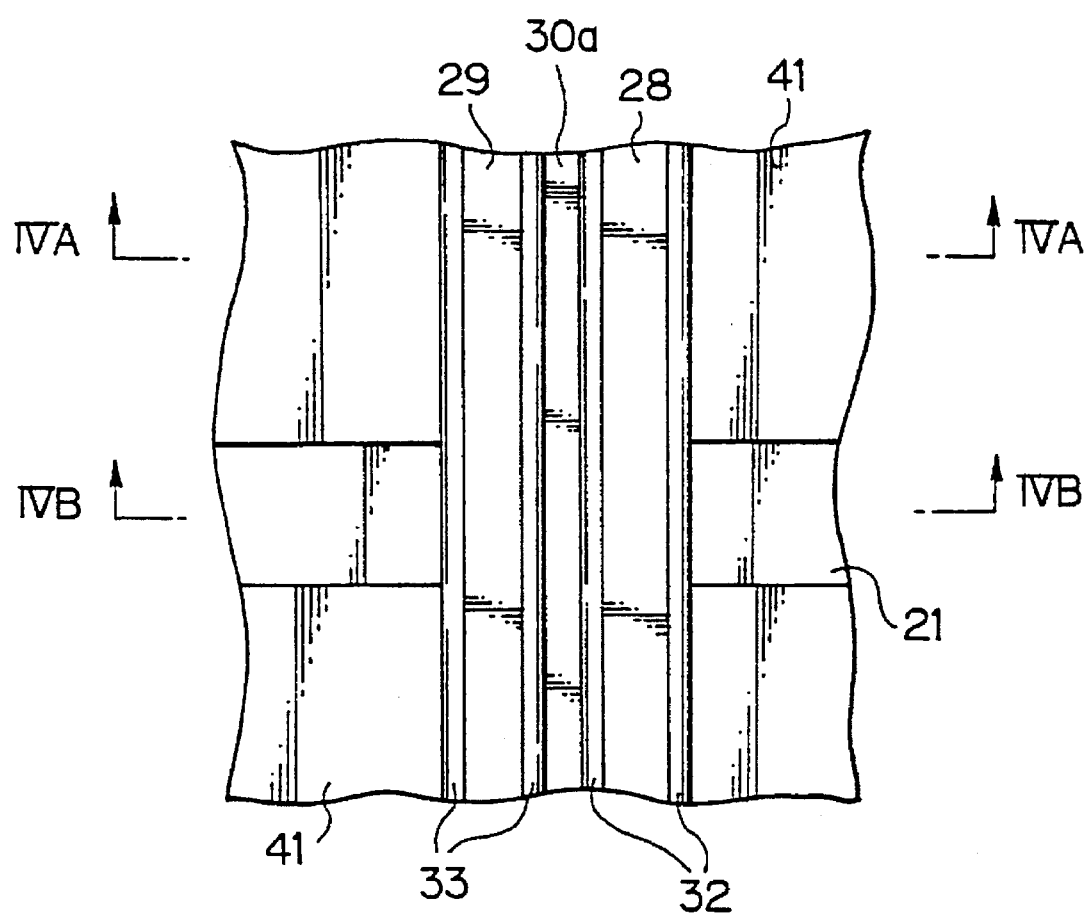
FIG. 3 shows a top view of a flash memory according to the invention.
Figure 4A:
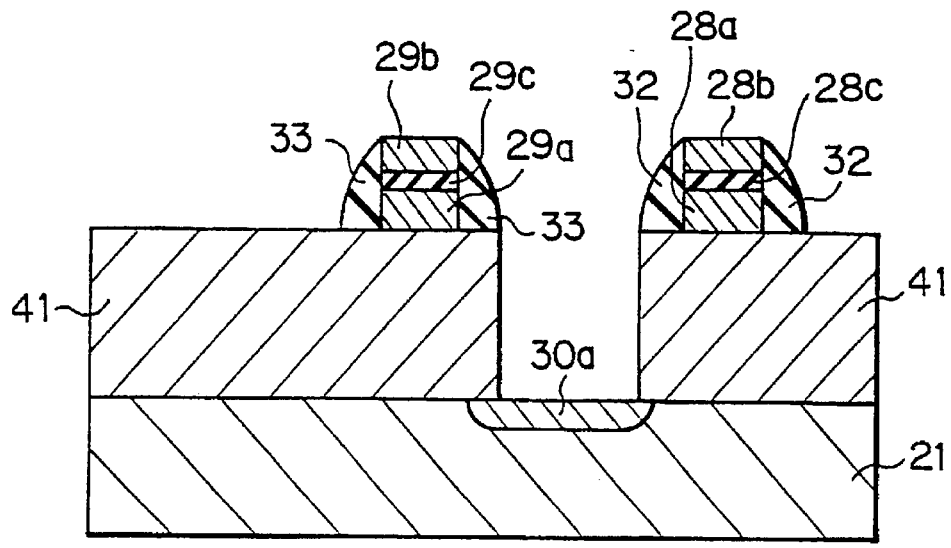
FIGS. 4A and 4B are sectional views of the flash memory in FIG. 3, taken along the lines IVA—IVA and IVB—IVB, respectively.
Figure 4B:
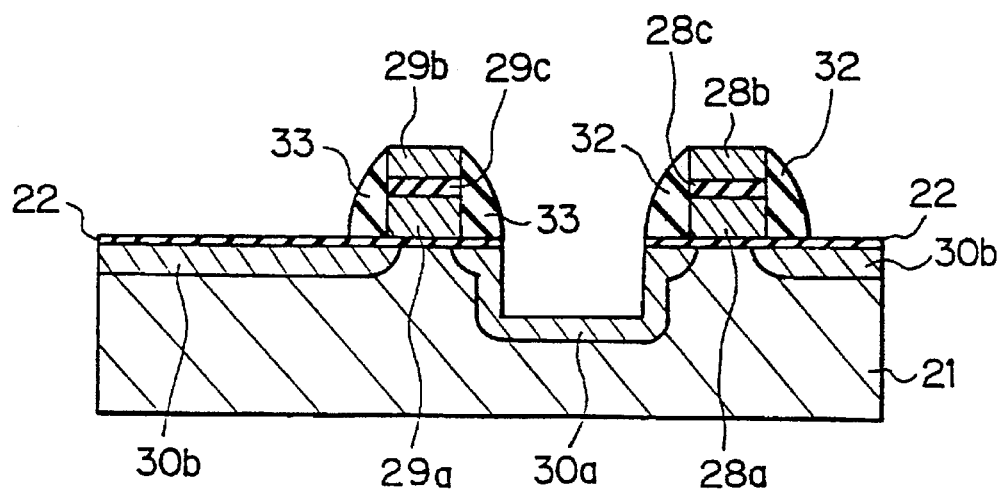

FIG. 3 shows a top view of the flash memory of the invention after the completion of the formation of the source electrode 30a and before the forming of the interlayer insulation films 36, 37, and FIGS. 4A and 4B show sectional views taken along IVA—IVA line and IVB—IVB line in FIG. 3, respectively. As can be seen from these drawings, the flash memory of the invention has a pair of gate portions 28, 29 consisting of the floating gate electrode 28a, 29a, the control gate electrode 28b, 29b, and the inter-gate insulation film 28c, 29c, each of the gate portions 28, 29 having the side walls 32, 33 of an insulator along the longitudinal direction thereof, and the common source electrode 30a for the pair of gate portions 28, 29 therebetween. In the portion in which the gate portions 28, 29 are situated on the gate oxidation film 22, as a result of the simultaneous etching of the field oxidation film 41 having a larger thickness and the gate oxidation film 22 having a smaller thickness, the source electrode 30a is formed in the trench made in the substrate 21 before the completion of the etching of the thicker field oxidation film 41. The trench in this portion would be eliminated if an etchant is used which selectively etches silicon dioxide and does not etch silicon.

In the stacked gate portion shown in FIG. 4B, the gate electrode also functions as a word line. The gate portion is therefore extended across the field insulation film 41, as shown in FIG. 4A.

As can be seen in FIG. 4A, the surface of a semiconductor substrate 21 must be exposed in the area of the field insulation film 41 in order to form the impurity doped region 30a for a common source electrode. The patterning of the field insulation film 41 to make the impurity doped region 30a is usually carried out by reactive ion etching (RIE). In the case of etching by RIE, although RIE is a vertically anisotropic etching, a little etching in the lateral direction occurs. Accordingly, the side walls 32, 33 are influenced by the lateral etching. Furthermore, the side wall has a certain width and is exposed to active ions from above. The field insulation film 41 underlying the stacked gate portion should have a large thickness so as not to decrease the effect of the film 41 on the electrical insulation. However, in the case of a thicker insulation film 41, RIE must be carried out for a long time accordingly. During this etching, the side walls gradually become small under the influence thereof.

The field insulation film 41 is most easily formed by a LOCOS process. In the case of use of an oxide film, such as a thermally oxidized film by a LOCOS process, for the field insulation film 41, when the side wall are formed of silicon nitride, a high etching rate ratio of $SiO_2$ to $Si_3N_4$ is obtained for etching the silicon oxide film by RIE.

Thus, the problem can be solved that the side walls are lost during the etching of the field insulation film even if a thin stacked gate portion has been formed in contrast with the field insulation film which must be thick, when silicon oxide is selected for the field insulation film and silicon nitride for the side walls. That problem may be avoided by increasing the thickness of the stacked gate portion and forming a thick side wall accordingly, but this is not practical. The formation of such a thick stacked gate portion tends to increase the unevenness of an interlayer insulation film formed over the gate portion, opposing desired planarization of the insulation film, and makes it difficult to form a multi-layered interconnection.

Figure 5:
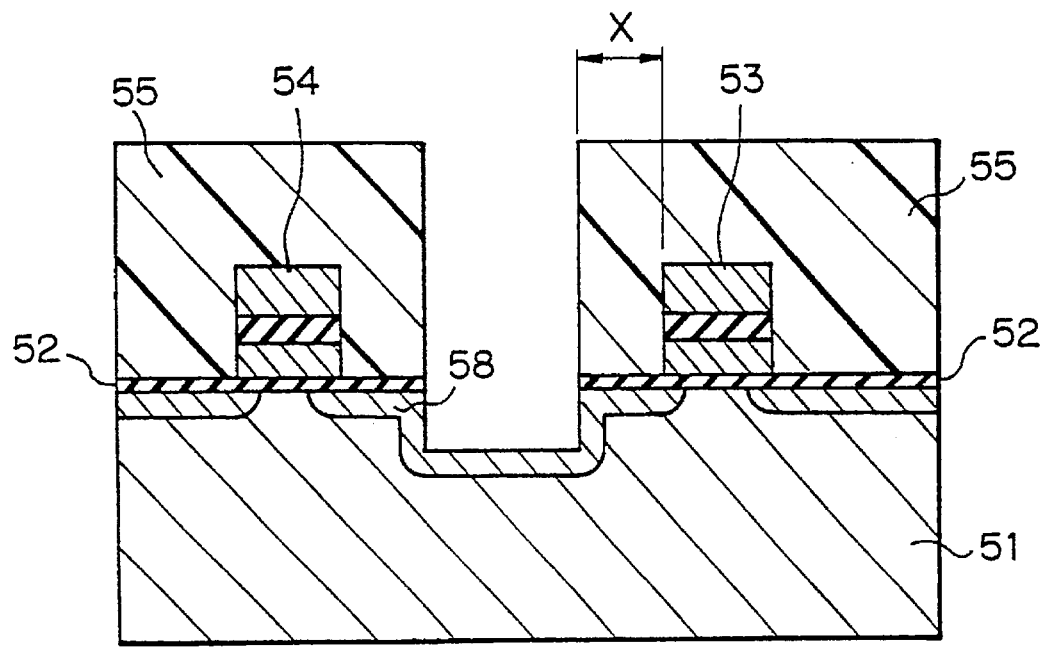
FIG. 5 illustrates the removal of field oxidation films of a conventional method of producing a flash memory.

FIG. 5 shows a step of the removal of field oxidation films (not shown) of a conventional method of manufacturing a flash memory. (This step corresponds to the removal of oxidation films of the method of the invention illustrated by FIG. 2E.) In this method, to avoid damage owing to reactive ion etching, as described hereinbefore, a portion of gate oxidation film 52 between a pair of gate portions 53, 54 and adjacent thereto is covered by a resist 55, with a margin X for alignment. This method thus involves the surplus margin, and is not capable of self-alignedly making a source electrode 58 in a semiconductor substrate 51. Accordingly, this method is not very appropriate to produce a higher integrated flash memory.

Figure 6:
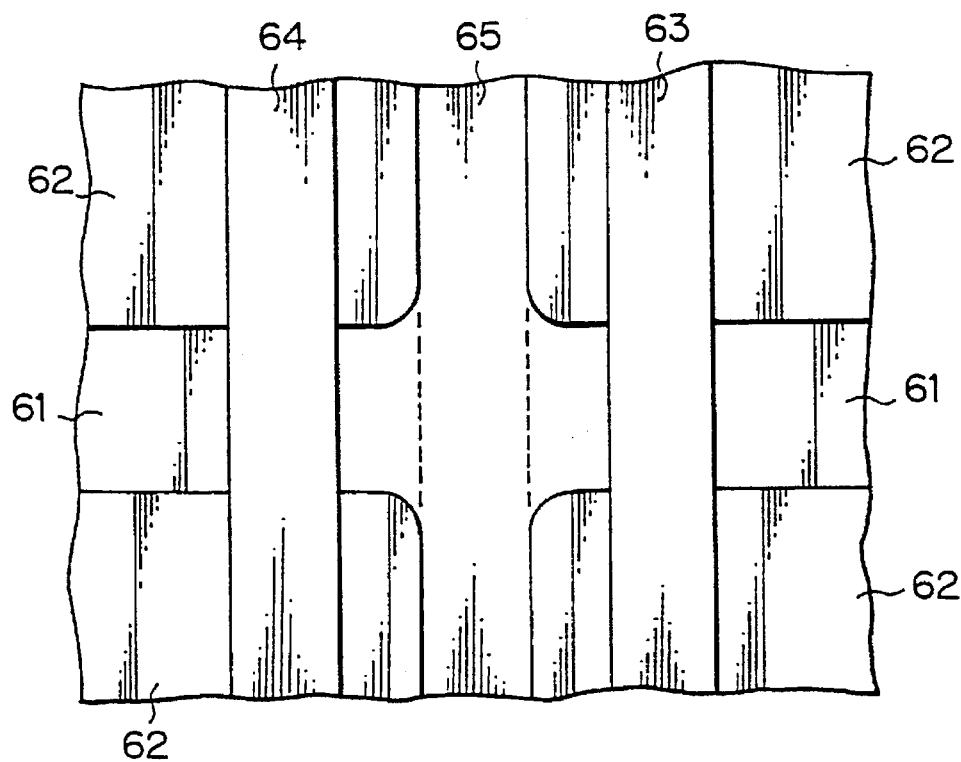
FIG. 6 shows a top view of a flash memory in the middle course of the production by another conventional method.

FIG. 6 shows a top view of a flash memory in the middle course of the production according to another conventional method, in which field oxidation films 62 are initially patterned to a given configuration for making a source electrode 65, and gate portions 63, 64 are then formed on a gate insulation film 61 and the field oxidation film 62. In this method, a larger margin for alignment is required for the reasons shown below.

When a field oxidation film is patterned, bird's beaks are unavoidably formed at an edge of the film. By the formation of the bird's beaks, the corners of each of the patterned field oxidation films are rounded regardless of a rectangular shape of the pattern to be formed, because the bird's beaks are concentrated at the corner, and the intrusion of the bird's beaks into the film is noticeable. In this situation, gate portions which are patterned across the field oxidation films must be patterned so as to keep away from the rounded corners. Namely, the pattern for the gate portion is not permitted to be placed near an edge of the field insulation film. Accordingly, in this known method, a certain area of the field oxidation film near the edge thereof must be secured as a margin area, which results in the increase of a dead zone. This is true of all the areas in a chip, and causes the prevention of the production of a highly integrated flash memory.

In general, conventional methods thus fail to allow the self-aligned production of a highly integrated flash memory.

The invention having been described by way of example, a person with ordinary skill in the art may make any change, modification, or variation in the described embodiments of the invention without departing from the spirit and scope of the invention.

I claim:

1. A method of producing a flash memory of NOR-type comprising at least a pair of stacked gate portions consisting essentially of a first gate electrode provided over a surface of a semiconductor substrate through a gate insulation film interposed therebetween, an inter-gate insulation film on the first gate electrode, and a second gate electrode on the inter-gate insulation film, and source and drain electrodes used to charge electrons for data storage to the first gate electrode and discharge the same therefrom, the method comprising:

(a) forming gate insulation films and field insulation films on a surface of a semiconductor substrate of a first conductivity type,
  (b) forming at least a pair of gate portions on surface regions of the gate insulation films and the field insulation films by patterning, the gate portion consisting essentially of a floating gate electrode, a control gate electrode, and an inter-gate insulation film between the floating and control gate electrodes,
  (c) introducing an impurity of a conductivity type opposite to the substrate into the regions not covered by the gate portions and along the longitudinal direction of the gate portions,
  (d) forming an insulator film so as to cover the gate portions and the films on the substrate,
  (e) etching back the insulator film using an etchant gas having a sufficient difference of etching rates for the gate portion and the insulator film so as to expose the gate insulation film and selectively leave side walls adjacent to the sides of the gate portion, thereby covering portions of the films adjacent to the gate portion,
  (f) exposing the portion of semiconductor substrate located between the pair of gate portions and uncovered by the side walls formed in step (e), by selectively etching the field insulation films on the to be exposed portion of the substrate, and
  (g) selectively introducing an impurity of the conductivity type opposite to the substrate into the region of the exposed substrate between the pair of gate portions, thereby forming an impurity introduced region in the substrate between the pair of gate portions, which extends to a portion of the substrate situated under a part of each of the gate portions.

2. The method of claim 1, wherein the field insulation films are formed by local oxidation of the substrate wherein the substrate is composed of silicon.

3. The method of claim 2, wherein the gate insulation films are formed by thermal oxidation of the substrate of silicon after the formation of the field oxidation films.

4. The method of claim 1, wherein the floating gate and control gate electrodes are formed by chemical vapor deposition of a semiconductor material doped with an impurity.

5. The method of claim 4, wherein the semiconductor material is silicon.

6. The method of claim 4, wherein the inter-gate insulation film is formed by thermal oxidation of the semiconductor material of the floating gate electrode.

7. The method of claim 5, wherein the inter-gate insulation film is formed by thermal oxidation of the top portion of a silicon material for the floating gate electrode, subsequent chemical vapor deposition of silicon nitride on the thermally oxidized silicon, and further thermal oxidation of the top portion of the deposited silicon nitride, thus having a three-layer construction.

8. The method of claim 1, wherein the gate portion is formed by patterning a laminate consisting of layers of a material for the control gate electrode, a material for the inter-gate insulation film, and a material for the floating gate electrode in sequence.

9. The method of claim 8, wherein the patterning of each of the layers of the laminate is effected by reactive ion etching.

10. The method of claim 1, wherein the insulator film covering the gate portions is formed by chemical vapor deposition of silicon nitride.

11. The method of claim 10, wherein the subsequent etchback of the insulator film is achieved using a gaseous mixture of $CF_4$ and $O_2$ as an etchant.

12. The method of claim 1, wherein the side wall is formed so as to have a width at the bottom portion thereof of at least about 1000 angstroms.

13. The method of claim 1, wherein the selective etching of the insulator film in step (e) is effected by reactive ion etching.

14. The method of claim 13, wherein the reactive ion etching uses a gaseous mixture of $CF_4$ and $CHF_3$.

15. The method of claim 1, wherein the side walls are used as a part of a mask for making the impurity introduced region in step (g).

16. The method of claim 15, wherein the gate portions are also used as a part of the mask for making the impurity introduced region in step (g).

17. The method of claim 1, which further comprises forming an interlayer insulating film after step (g), so as to cover the gate portions, the side walls adjacent thereto, the impurity introduced region, and the gate insulation film on the substrate.

18. The method of claim 17, wherein the interlayer insulating film is made up of two layers of insulating material, and the underlying layer is formed by chemical vapor deposition of silicon dioxide, and the overlaying layer is formed of borophosphosilicate glass or phosphosilicate glass.

19. The method of claim 17, which further comprises opening contact holes penetrating the interlayer insulation film and the gate insulation film, and a film of a conductive material for an interconnection layer is then formed to thereby fill the contact hole.

20. The method of claim 19, wherein aluminum is used as the conductive material.

21. The method of claim 20, wherein a titanium film and then a titanium nitride film are formed prior to the formation of the conductive film of aluminum.

* * * * *